United States Patent [19]
Ferrett

[11] Patent Number: 4,927,771
[45] Date of Patent: May 22, 1990

[54] METHOD OF THERMAL ISOLATION OF DETECTOR ELEMENTS IN AN UNCOOLED STARING FOCAL PLANE ARRAY

[75] Inventor: Donald A. Ferrett, Prince William Co., Va.

[73] Assignee: The United States of America as represented by the Secretary of the Army, Washington, D.C.

[21] Appl. No.: 319,788

[22] Filed: Mar. 7, 1989

[51] Int. Cl.⁵ .......................................... H01L 27/144
[52] U.S. Cl. .................................... 437/3; 437/5;
    437/49; 437/50; 437/67; 437/185; 437/225;
    437/228; 437/974; 357/32; 250/332
[58] Field of Search ............... 437/3, 4, 5, 48, 49,
    437/50, 67, 225, 228, 235, 243, 974, 185;
    357/30, 32; 250/332, 342

[56] References Cited
U.S. PATENT DOCUMENTS

| | | | |
|---|---|---|---|
| 4,225,786 | 9/1980 | Perlman | 250/342 |
| 4,273,596 | 6/1981 | Gutierrez et al. | 437/3 |
| 4,290,844 | 9/1981 | Rotolante et al. | 250/332 |
| 4,403,238 | 9/1983 | Clark | 357/30 |
| 4,449,044 | 5/1984 | Rotolante et al. | 357/32 |
| 4,451,842 | 5/1984 | Pommerrenig | 357/30 |
| 4,532,424 | 7/1985 | Cheung | 250/332 |
| 4,593,456 | 6/1986 | Cheung | 437/3 |
| 4,672,737 | 6/1987 | Carson et al. | 437/3 |
| 4,754,139 | 6/1988 | Ennulat et al. | 250/332 |

*Primary Examiner*—Olik Chaudhuri
*Attorney, Agent, or Firm*—Milton W. Lee; Max L. Harwell; Anthony T. Lane

[57] ABSTRACT

A method of thermally isolating detector elements in an uncooled focal plane array. A backfill material of arsenic trisulfide is deposited inside reticulated grooves in a detector material to provide strength prior to the step of bump bonding the detector elements of the detector material to a readout device array. After the bump bonding step, an oxygen rich gas, such as a dry oxygen and nitrogen mixture, is flowed between the detector and readout arrays to remove the arsenic trisulfide material therefrom leaving an air gap between the detector elements.

7 Claims, 2 Drawing Sheets

METHOD OF THERMAL ISOLATION OF DETECTOR ELEMENTS IN AN UNCOOLED STARING FOCAL PLANE ARRAY

The invention described herein may be manufactured, used, and licensed by the U.S. Government for governmental purposes without the payment of any royalties thereon.

BACKGROUND OF INVENTION

1. Field

The present invention is in the field of thermally isolating pixels and strengthening an uncooled staring focal plane array, and specifically a method of depositing an easily sublimateable backfill material in reticulated grooves of a detector material prior to bonding the detector material to a readout array and then sublimating the backfill material out of the grooves to leave air gaps between the detector elements.

2. Prior Art

A problem exists in thermally isolating detectors in uncooled detector focal plane arrays. Thermal crosstalk between adjacent elements significantly reduces the responsivity and modulation transfer function of these devices. Complete reticulation of these arrays is the ideal solution to this problem. However, the reticulation leaves the detectors as isolated cubes of material held together only by a top common electrode and an absorbing layer. The array is too fragile to withstand bonding to the readout array. A backfill material deposited in the reticulation grooves solves the structural weakness problem during the bonding prcess, but the backfill materials previously used are not easily removed after the detector array and readout array are bonded together. While some backfill materials improve the lateral heat transfer problem, none of these materials are as good as an air gap for preventing heat transfer.

SUMMARY OF THE INVENTION

The present invention provides a solution to the thermal isolation problem by using arsenic trisulfide or materials with similar properties, as the backfill material. One of the unique properties of arsenic trisulfide is that it sublimates when heated in an oxygen environment. Thus, arsenic trisulfide may be used as the backfill material and, after the bonding step, be easily removed by the step of directing a jet of warm, oxygen-rich gas between the detector and readout arrays to remove the arsenic trisulfide. The arsenic trisulfide sublimates out of the reticulation grooves leaving the desired air gaps between the detectors. Any waste products will be carried away in the flowing gas stream, leaving no residue in the channels or on the surface of the readout device. The structural integrity of the focal plane array produced by this method is maintained since the detector elements are held on the top by the common electrode and absorbing layer and on the bottom by the bump bond.

The invention will be better understood with reference to the detailed description along with the following drawings.

DETAILED DESCRIPTION OF THE EMBODIMENT

Figure 1:
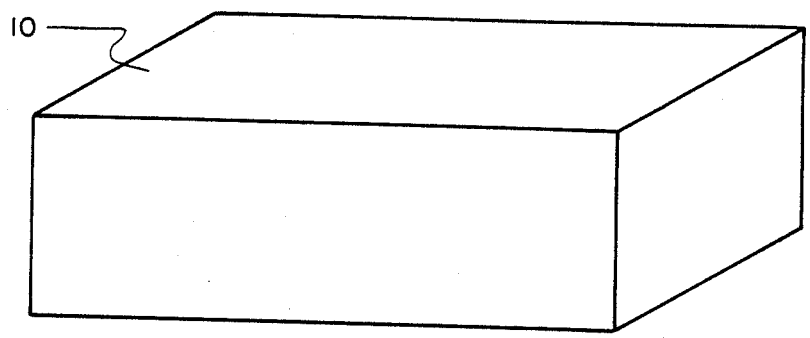
FIGS. 1 through 8 are referenced as appropriate in the detailed description of the preferred embodiment steps of thermal isolation of the detector elements in a focal plane array.
Figure 2:
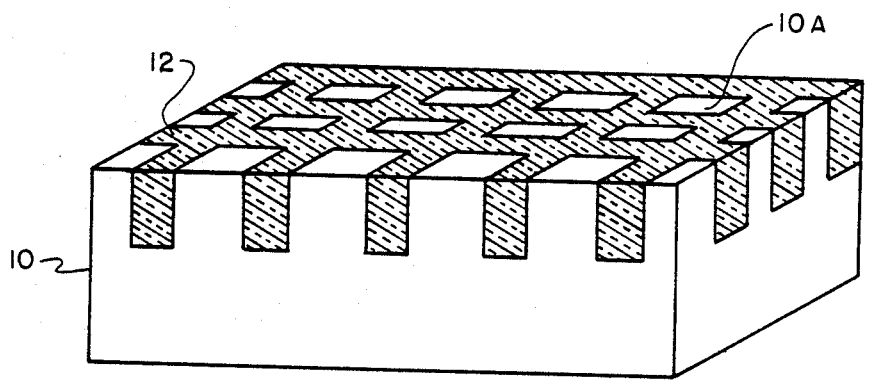

Refer sequentially to FIGS. 1 through 8 for the method of thermally isolating the detector elements in an uncooled staring focal plane array. FIG. 1 shows an unthinned wafer of detector material 10 used in the present method. Material 10 may be made of most any single crystal pyroelectric materials, such as lithium tantalate, strontium barium niobate, or potassium tantalate. Other materials 10 that can be used in the process may be ferroelectric ceramics, such as barium strontium titanate. FIG. 2 illustrates schematically wafer material 10 after it has been reticulated, preferably in an orthogonal pattern, and whose reticulation grooves have been backfilled by a backfill material 12, such as by evaporating arsenic trisulfide into the grooves. The reticulation step may be one of several available techniques. Some of these techniques may be ion beam milling, laser reticulation, or reactive ion etching depending on the detector material 10 chosen. The backfill material can be evaporated using a vapor deposition technique wherein an excess amount of material 12 is deposited to over flow the grooves.

Figure 3:
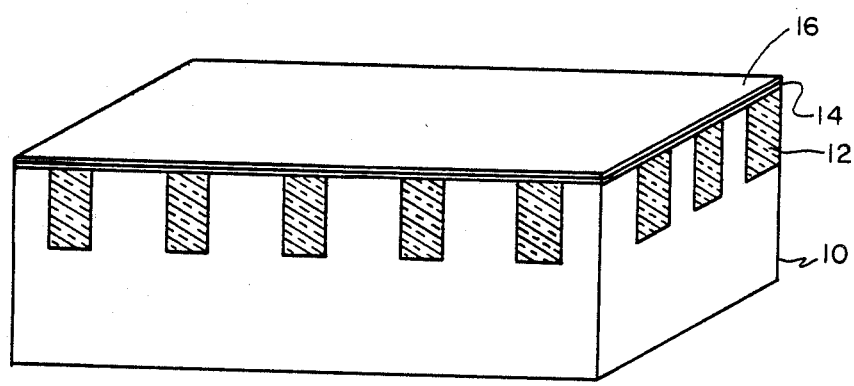

FIG. 3 schematically illustrates three more steps in the method. There is an initial cleaning step wherein the excess material 12 is polished off the surface. The final cleaning step may be performed by ion milling the surface of the arsenic trisulfide 12 down to the top of 10 forming an array of detector elements (10A of FIG. 2). The top electrode layer 14 and the absorbing layer 16 are seqentially evaporated on the cleaned surface.

Figure 4:
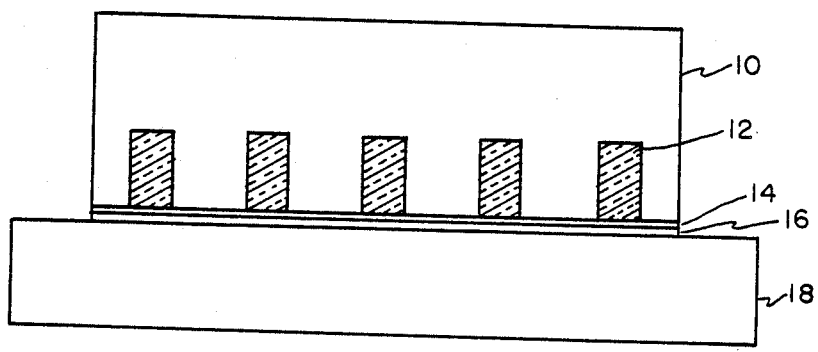
Figure 5:
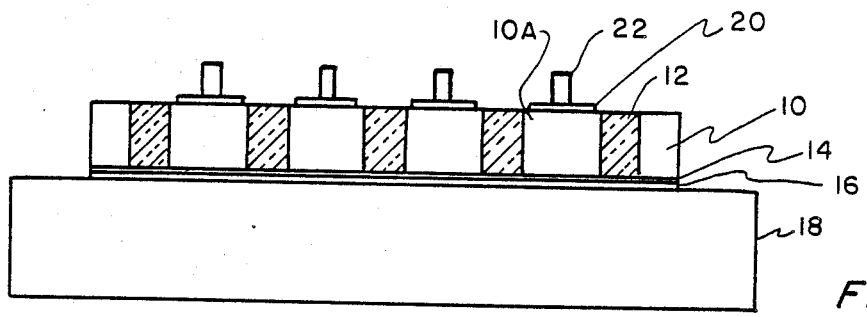

Referring to the FIG. 4 illustration, the step of inverting the wafer 10 and mounting on a support material 18 for thinning wafer 10 to a final thickness, preferably until material 12 is exposed, is depicted. Material 18 may be a glass blank. Wafer 10 is still relatively thick at this step and is therefore rather rugged. Thus, no special handling is required. Wafer 10 is thinned using polishing techniques with possibly a final thinning step of ion milling. FIG. 5 illustrates schematically the wafer 10, still mounted on the support material 18, after the step of thinning and two more steps of depositing a metal pad 20 and a solder bump 22 on the back side of each of the detector elements 10A. Pads 20 may be formed using standard mask/deposition steps. Bumps 22 may be fabricated using various known processes. Each focal plane array manufacturer has their own method of thermally isolating the detector arrays from the readout device. The only new requirement that the use of the arsenic trisulfide places on the various processes is that the temperature of the detector array cannot exceed 170 degrees Celsius during the steps of pad and bump depositions. If the array temperature exceeds 170 degrees Celsius, the arsenic trisulfide will begin the thermal sublimation process earlier then desired.

Figure 6:
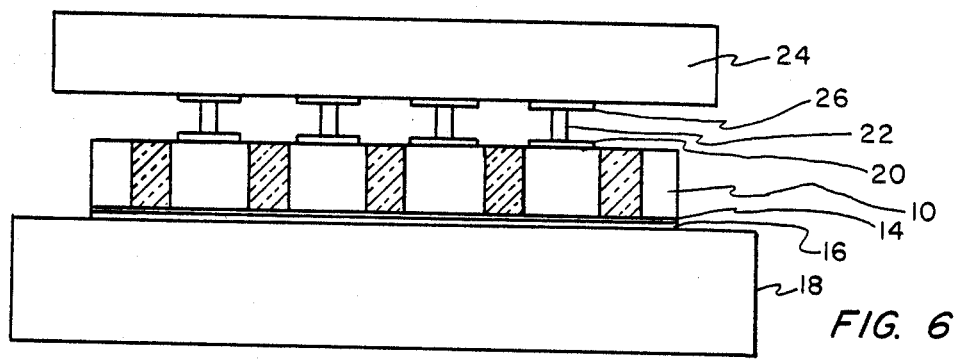

Using the schematic illustration of FIG. 6, the next step in the method is bump bonding the readout device 24 to the bumps 22 through metal pads 26. Various readout devices 24 may be used. Devices 24 may be charge coupled devices (CCDs) or switch matrices with or without unit cell amplification. The method of bump bonding is well known. There are alignment marks on the readout device which show where the detector array needs to be located. Bonding machines are available which allow two small flat plates, such as in this case plates 18 and 24, to be slowly pushed together in parallel.

Figure 7:
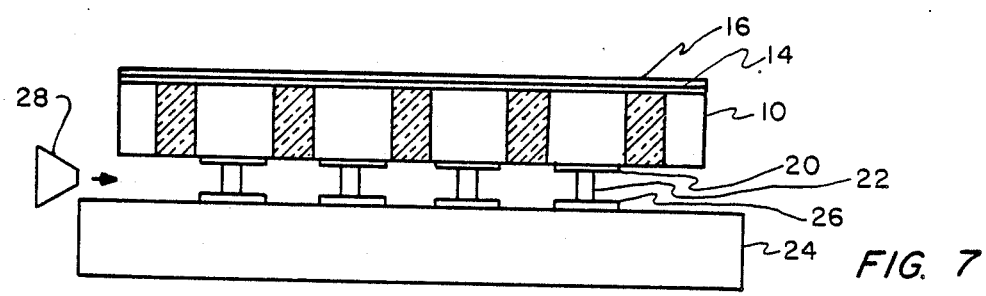
Figure 8:
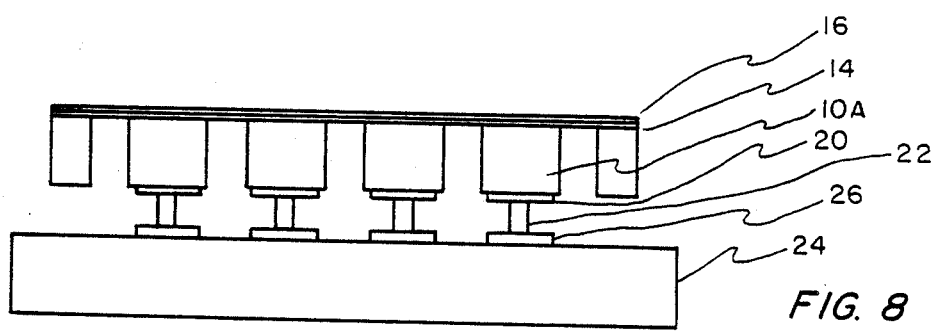

FIG. 7 illustrates another inversion step followed by the steps of removing the support material 18 from absorbing layer 16 and jetting an oxygen rich gas between the detector 10 and readout arrays 24 in the open space formed around the bump bonds. The bonded detector and readout package may be placed on a rotating stage in an enclosure (not shown). The gas is directed between 10 and 24 from a stationary position, as represented by numeral 28 and is jetted through in all directions during each of the full 360 degrees of rotation of the detector and readout package. Exhaust gases are removed from the enclosure by a vacuum pump (not shown). The oxygen rich gas is preferably a dry oxygen and nitrogen mixture. The ratio of oxygen to nitrogen will determine the sublimation rate of the arsenic trisulfide. A higher fraction of oxygen will lead to higher sublimation rate. The temperature of the gas should be greater than 200 degrees Celsius to facilitate the thermal oxidation of material 12. The gas flow rate will vary depending on the size of the array, but will be at least 2 liters per minute. FIG. 8 illustrates the completed focal plane array in which air gaps prevent heat from being transferred between the detector elements.

I claim:

1. A method of thermally isolating detector elements in an uncooled staring focal plane array, said method comprising the steps of:

providing an unthinned wafer of detector material;

reticulating said wafer to form reticulated grooves and isolated detector elements;

backfilling said reticulated grooves by evaporating arsenic trisulfide as removable backfill material therein until said reticulated grooves are filled to overflow to strengthen the reticulated wafer;

cleaning excess backfill material down to the top of said detector elements;

evaporating a top electrode layer over the surface formed by said backfill material and said top of said detector elements;

evaporating an absorber layer over said top electrode layer;

inverting said unthinned wafer of detector material and mounting on a layer of support material;

thinning said unthinned wafer to a final thickness wherein said backfill material is exposed forming isolated detector elements;

depositing a metal pad and solder bump sequentially on each of said isolated detector elements wherein the temperature of deposition never exceeds 170 degrees Celsius to prevent thermal sublimation of said arsenic trisulfide removable backfill material;

bump bonding a readout device to each of said solder bumps;

inverting said readout device and the thinned wafer and removing said layer of support material from said absorber layer; and jetting an oxygen rich gas between the detector array and said readout device in the open space formed around the bump bonds to remove said arsenic trisulfide removable backfill material from said reticulated grooves wherein said bonded detector array and readout device are fixed on a rotating stage in an enclosure and a nozzle jetting said oxygen rich gas is stationary so that said gas is jetted through the open space from all directions as the array and device are rotated wherein said oxygen rich gas sublimates and carries away the arsenic trisulfide out of said reticulated grooves to leave thermal isolation air gaps between said detector elements.

2. A method as set forth in claim 1 wherein said step of providing unthinned wafer of detector material is providing a single crystal pyroelectric material.

3. A method as set forth in claim 2 wherein said step of reticulating is by ion beam milling.

4. A method as set forth in claim 3 wherein said step of cleaning excess backfill material is in two steps wherein a first step is polishing and a second step is by ion milling said arsenic trisulfide down to the tops of said detector elements.

5. A method as set forth in claim 4 wherein said step of mounting said unthinned wafer of detector material on said layer of support material is by mounting on a glass blank.

6. A method as set forth in claim 5 wherein said step of thinning said unthinned wafer is by polishing and ion milling.

7. A method as set forth in claim 6 wherein said step of jetting an oxygen rich gas is jetting a dry oxygen and nitrogen mixture at a temperature greater than 200 degrees Celsius to facilitate oxidation of said arsenic trisulfide and at a flow rate about 2 liters or more per minute while exhaust gases are continuously removed from said enclosure.

* * * * *